(12) United States Patent
Kubo et al.

(10) Patent No.: US 10,039,215 B2
(45) Date of Patent: Jul. 31, 2018

(54) POWER CONVERTER

(71) Applicant: Kabushiki Kaisha Yaskawa Denki, Kitakyushu-shi (JP)

(72) Inventors: Yuto Kubo, Kitakyushu (JP); Makoto Nakaya, Kitakyushu (JP); Tetsuo Yanagimoto, Kitakyushu (JP); Ryosuke Tsumagari, Kitakyushu (JP)

(73) Assignee: KABUSHIKI KAISHA YASKAWA DENKI, Kitakyushu-shi (JP)

( * ) Notice: Subject to any disclaimer, the term of this patent is extended or adjusted under 35 U.S.C. 154(b) by 0 days.

(21) Appl. No.: 15/343,394

(22) Filed: Nov. 4, 2016

(65) Prior Publication Data

US 2017/0150654 A1 May 25, 2017

(30) Foreign Application Priority Data

Nov. 20, 2015 (JP) ................................. 2015-228120

(51) Int. Cl.
| | |
|---|---|
| H05K 7/20 | (2006.01) |
| H02M 7/00 | (2006.01) |
| H05K 5/03 | (2006.01) |
| H05K 7/14 | (2006.01) |

(52) U.S. Cl.
CPC ........ *H05K 7/20909* (2013.01); *H02M 7/003* (2013.01); *H05K 5/03* (2013.01); *H05K 7/1427* (2013.01); *H05K 7/20918* (2013.01)

(58) Field of Classification Search
None
See application file for complete search history.

(56) References Cited

U.S. PATENT DOCUMENTS

| | | | |
|---|---|---|---|
| 2009/0034309 A1* | 2/2009 | Ibori | H02M 7/003 363/141 |
| 2013/0049550 A1 | 2/2013 | Watanabe et al. | |
| 2013/0141850 A1* | 6/2013 | Honda | H01G 2/04 361/679.01 |

FOREIGN PATENT DOCUMENTS

| | | |
|---|---|---|
| JP | 11-225498 A | 8/1999 |
| JP | 2008-103576 A | 5/2008 |
| JP | 2010219259 A * | 9/2010 |

(Continued)

OTHER PUBLICATIONS

Office Action dated Jan. 17, 2017 in Japanese Patent Application No. 2015-228120 (with unedited computer generated English translation).

Primary Examiner — Dimary Lopez Cruz
Assistant Examiner — Zhengfu Feng
(74) Attorney, Agent, or Firm — Oblon, McClelland, Maier & Neustadt, L.L.P.

(57) ABSTRACT

A power converter includes a housing, a circuit element, and a cover. The housing includes a first space and a second space. In the first space, a circuit substrate is disposed. In the second space, a passage for a cooling fluid is disposed. The circuit element is disposed on the circuit substrate in the first space and protrudes into the second space. The cover covers at least a portion of the circuit element and includes a first portion and a second portion. The first portion protrudes from near the circuit substrate into the second space, and defines a first region that has a first area. The second portion protrudes from the first portion, and defines a second region that has a second area. The first area is larger than the second area as viewed from a direction in which the circuit element protrudes.

20 Claims, 11 Drawing Sheets

(56) References Cited

FOREIGN PATENT DOCUMENTS

| JP | 2011-163231 A | 8/2011 |
|----|---------------|--------|
| JP | 2013-143439 A | 7/2013 |

* cited by examiner

POWER CONVERTER

CROSS-REFERENCE TO RELATED APPLICATIONS

The present application claims priority under 35 U.S.C. § 119 to Japanese Patent Application No. 2015-228120, filed Nov. 20, 2015. The contents of this application are incorporated herein by reference in their entirety.

BACKGROUND

Field of the Invention

The embodiments disclosed herein relate to a power converter.

Discussion of the Background

Japanese Unexamined Patent Application Publication No. 11-225498 discloses an inverter apparatus that is disposed in a pump control cabinet.

SUMMARY

According to one aspect of the present disclosure, a power converter includes a housing, a circuit element, and a cover. The housing includes a first space and a second space. In the first space, a circuit substrate is disposed. In the second space, a passage for a cooling fluid is disposed. The circuit element is disposed on the circuit substrate in the first space and protrudes into the second space. The cover covers at least a portion of the circuit element and includes a first portion and a second portion. The first portion protrudes from near the circuit substrate into the second space, and defines a first region that has a first area. The second portion protrudes from the first portion, and defines a second region that has a second area. The first area is larger than the second area as viewed from a direction in which the circuit element protrudes.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF EMBODIMENTS

The embodiments will now be described with reference to the accompanying drawings, wherein like reference numerals designate corresponding or identical elements throughout the various drawings.

A power converter 1 according to this embodiment converts alternating-current (AC) power (for example, commercial three-phase AC power) or direct-current (DC) power into AC power (for example, three-phase AC power) of desired frequencies. Then, the power converter 1 outputs the converted AC power. Examples of applications of the power converter 1 include, but are not limited to, control systems of industrial machinery.

1. General Arrangement of Power Converter

Figure 1:
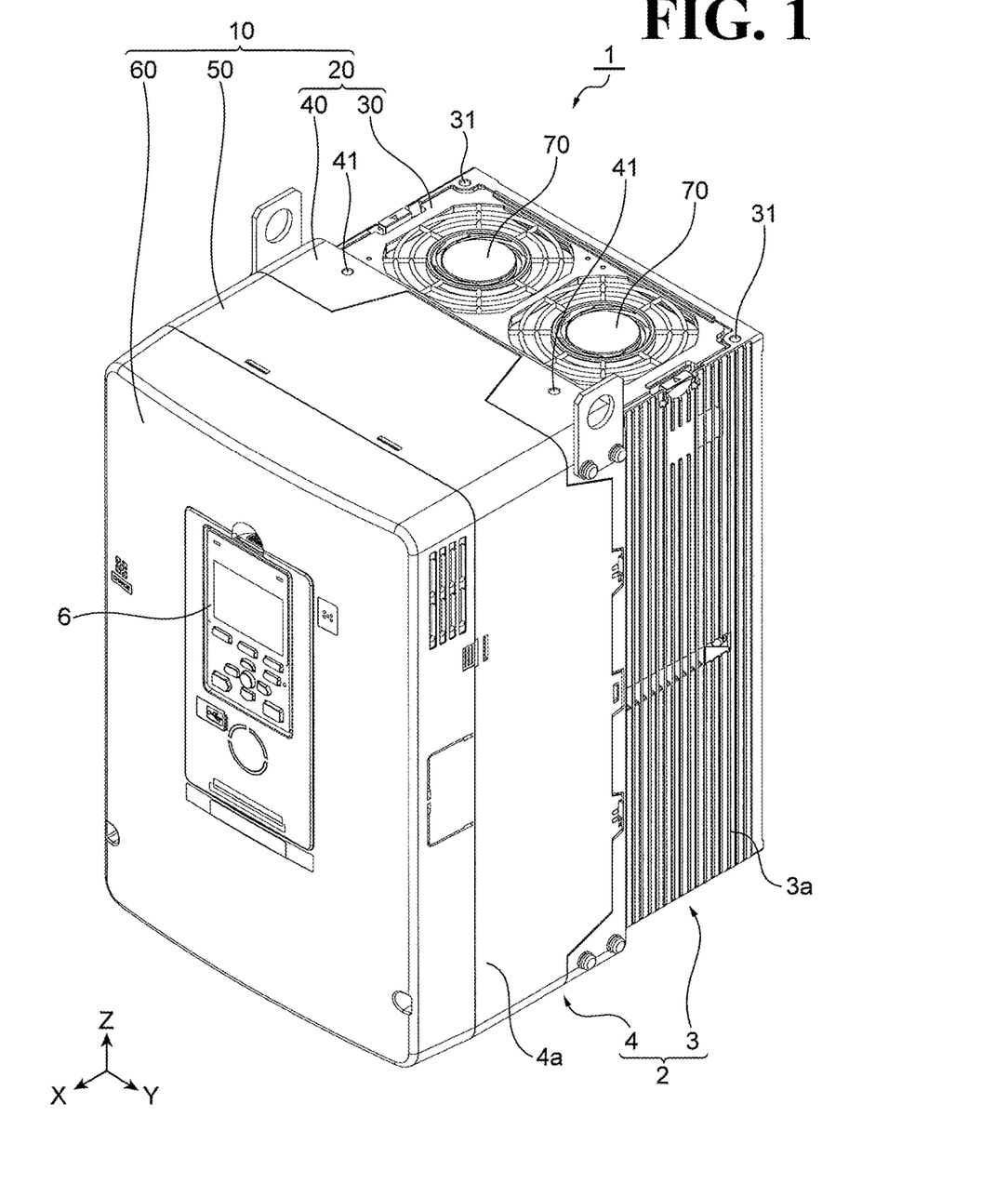
FIG. 1 is a perspective view of a power converter.
Figure 2:
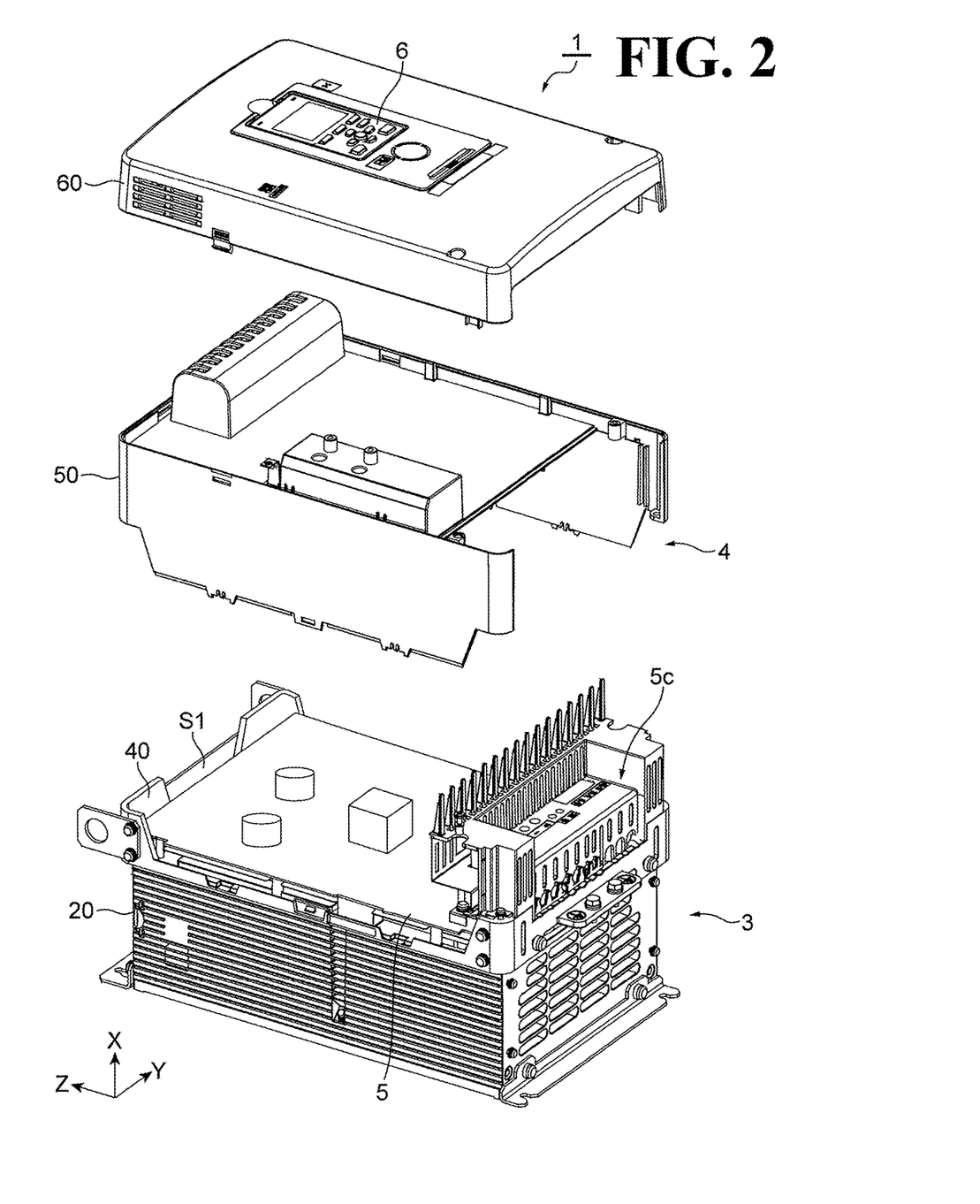
FIG. 2 is an exploded perspective view of the power converter.
Figure 3:
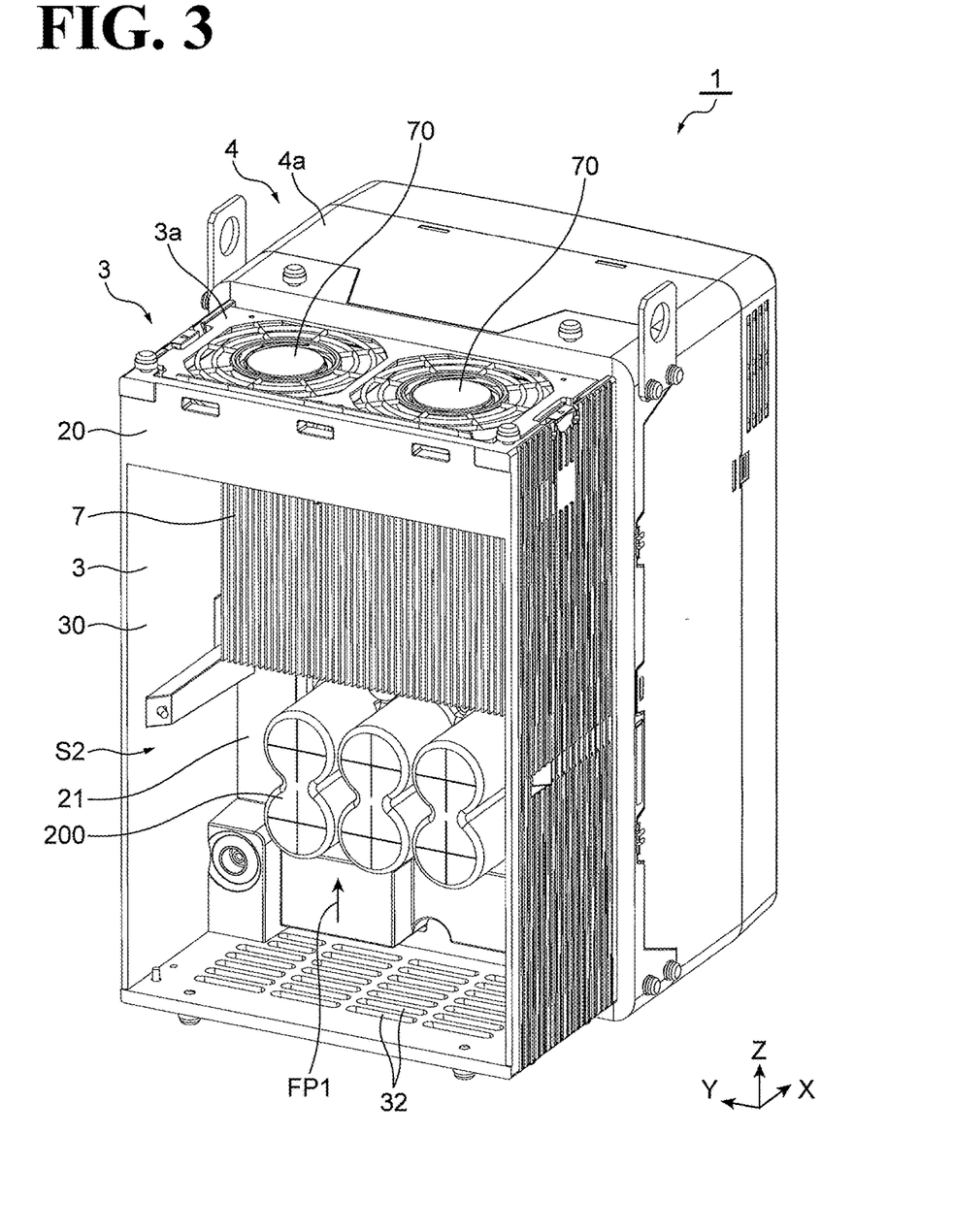
FIG. 3 is another perspective view of the power converter seen from another direction.

By referring to FIGS. 1 to 3, a specific configuration of the power converter 1 will be described. As used herein, the adjectives or adverbs "upward", "upper", "downward", and "lower" denote directions applicable when the power converter 1 is installed in its typical orientation. Also, the adjectives "front", "rear", "right", and "left" denote directions applicable when the power converter 1 is installed with its operation panel (described later) on the front side, and the side opposite to front side will be referred to as rear side. As illustrated in FIGS. 1 to 3 and other drawings, Z-axis positive direction is the upper direction, and X-axis positive direction is the front direction.

The power converter 1 includes a body 2. The body 2 houses a circuit substrate 5, which is used for power conversion purposes. The body 2 includes a first part 3 and a second part 4. The first part 3 and the second part 4 are adjacent to each other. The second part 4 houses the circuit substrate 5. The first part 3 is used to cool the circuit elements on the circuit substrate 5.

More specifically, the body 2 includes a housing 10. The housing 10 has a first space S1 and a second space S2. In the first space S1, the circuit substrate 5 is disposed. In the second space S2, a passage FP1 for cooling fluid is disposed. As illustrated in FIG. 2, the housing 10 includes a base housing 20, a first cover 50, and a second cover 60.

The base housing 20 includes a first piece 30 and a second piece 40. The first piece 30 is open in the rear direction. The second piece 40 is open in the front direction. The first part 30 and the second piece 40 are partitioned from each other by a wall 21 (see FIG. 3). In the second piece 40, the circuit substrate 5 is opposed to the wall 21. At a lower portion of the circuit substrate 5, a terminal 5c is disposed. The terminal 5c receives input-output electric wires.

The first cover 50 is mounted on the front side of the second piece 40, covering the circuit substrate 5 with the terminal 5c exposed. The first cover 50 and the second piece 40 together define the first space S1.

The second cover 60 is mounted on the front side of the first cover 50, covering the first cover 50 and the terminal 5c. The second piece 40, the first cover 50, and the second cover 60 together define the second part 4 of the body 2. The front surface of the second cover 60 is used as an operation panel with an operator 6.

The operator 6 receives inputs from a user of the power converter 1 and displays inside information of the power converter 1. The operator 6 may be attachable and detachable to and from the front surface of the second cover 60.

As illustrated in FIG. 3, the first piece 30 defines the second space S2. The first space S1 and the second space S2 are partitioned from each other by the wall 21. The wall 21 may have one or more openings. In this case, one or more openings belong to the second space S2. That is to say, the front surface of the wall 21 serves as the boundary between the first space S1 and the second space S2.

An exemplary configuration of the passage FP1 will be described. At a lower portion of the first piece 30, ventilation holes 32 are formed. At an upper portion of the first piece 30, at least one fan 70 is mounted. In this embodiment, two fans 70 are mounted. The fans 70 send air upward or downward to form an upward or downward air flow in the second space S2. The air constituting this air flow is a non-limiting example of the cooling fluid, and the passage through which the air flows is a non-limiting example of the passage FP1. The first piece 30 defines the first part 3 of the body 2.

The first part 3 includes cooling fins 7. The cooling fins 7 release heat coming from the circuit elements (for example, switching elements) on the circuit substrate 5. In another possible embodiment, the cooling fins 7 may be arranged somewhere along the passage FP1, in the second space S2 the first piece 30.

2. Protection Structure of Circuit Elements

Figure 4:
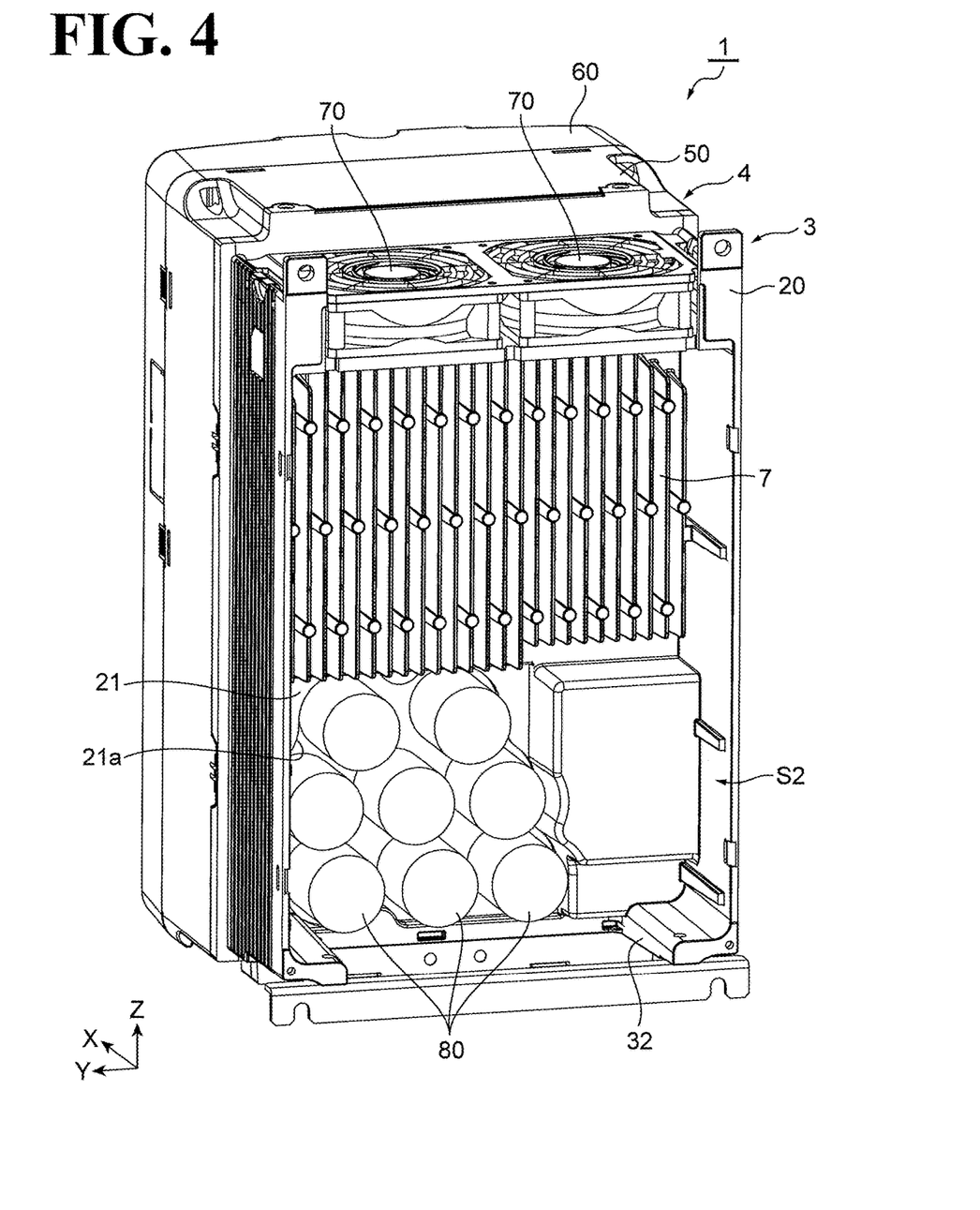
FIG. 4 is a perspective view of the power converter with its cover for circuit elements removed.

As illustrated in FIG. 4, the circuit substrate 5 includes at least one circuit element 80. The at least one circuit element 80 protrudes from inside the first space S1 into the second space S2. Examples of the at least one circuit element 80 include, but are not limited to, a capacitor, a reactor, and a relay. In the embodiment of FIG. 4, the at least one circuit element 80 is an electrolytic capacitor. Also in the embodiment of FIG. 4, the at least one circuit element 80 is disposed between the cooling fins 7 and the ventilation holes 32 (see FIG. 3), in the second space S2. At a lower portion of the wall 21, at least one opening 21a is formed. Through the opening 21a, the at least one circuit element 80 protrudes from the first space S1 to the second space S2.

Figure 5:
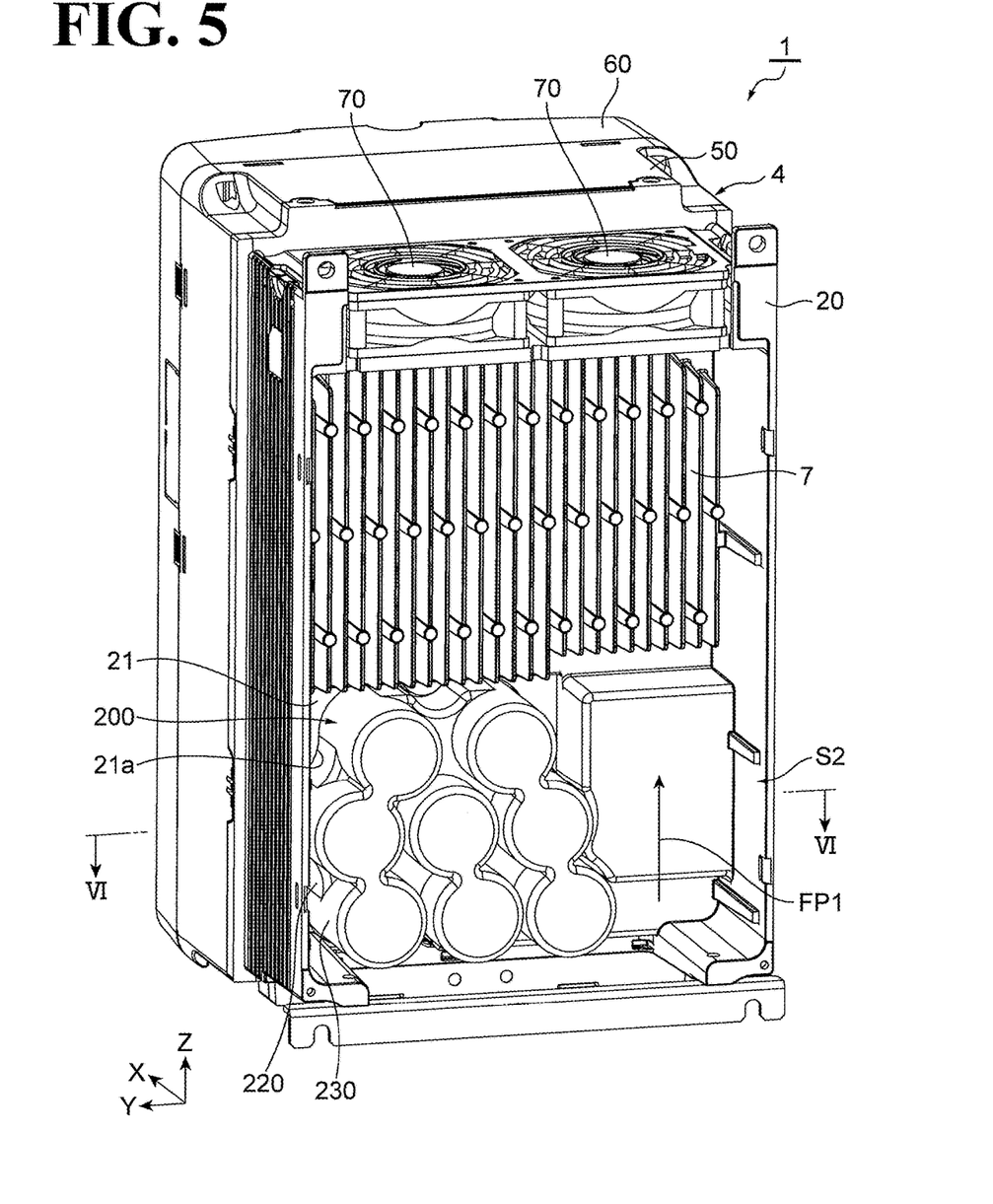
FIG. 5 is a perspective view of the power converter with its cover on the circuit elements.

As illustrated in FIG. 5, the power converter 1 includes a cover 200. The cover 200 covers at least a portion of the at least one circuit element 80.

Figure 6:
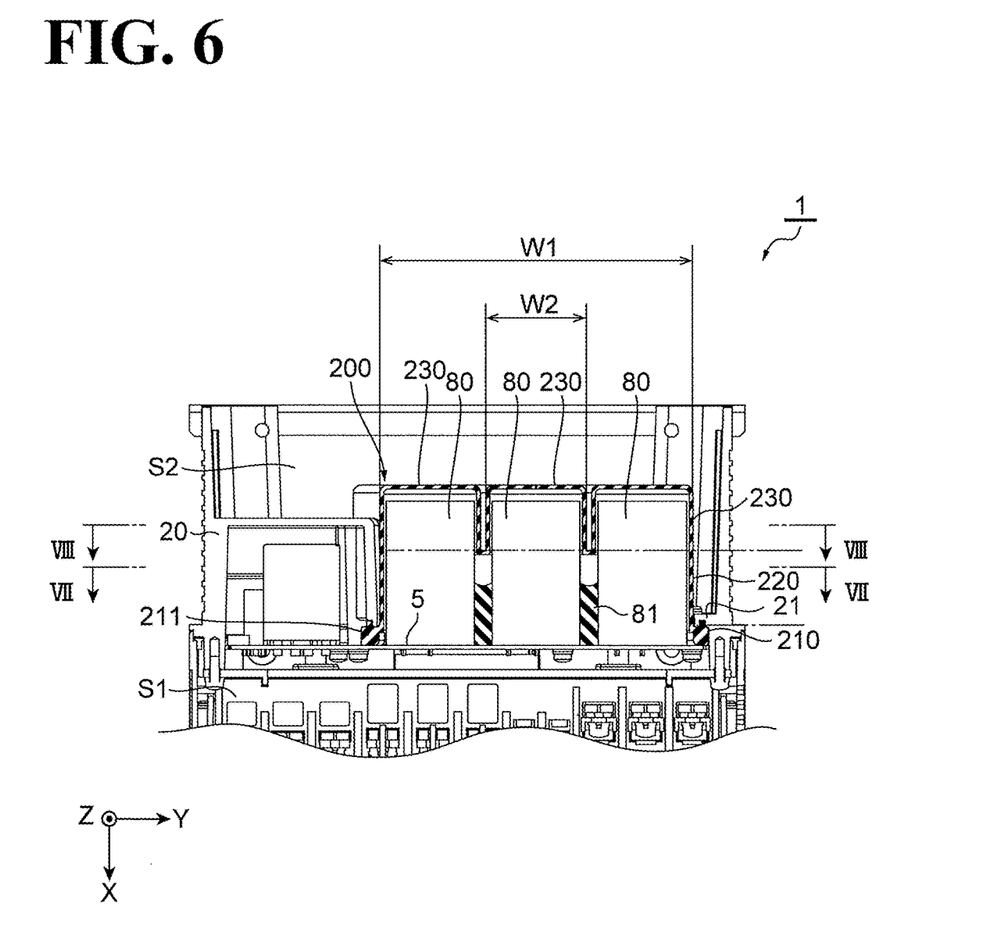
FIG. 6 is a sectional view taken along the line VI-VI illustrated in FIG. 5.

As illustrated in FIG. 6, the cover 200 includes a first portion 220 and a second portion 230. The first portion 220 is closer to the circuit substrate 5 than the second portion 230 is to the circuit substrate 5, and protrudes into the second space S2. The second portion 230 protrudes from the first portion 220. More specifically, the cover 200 includes a base 210, the first portion 220, and the second portion 230. The base 210 is in contact with the circuit substrate 5. The first portion 220 protrudes from the base 210 into the second space S2. The second portion 230 protrudes from the first portion 220.

Figure 7:
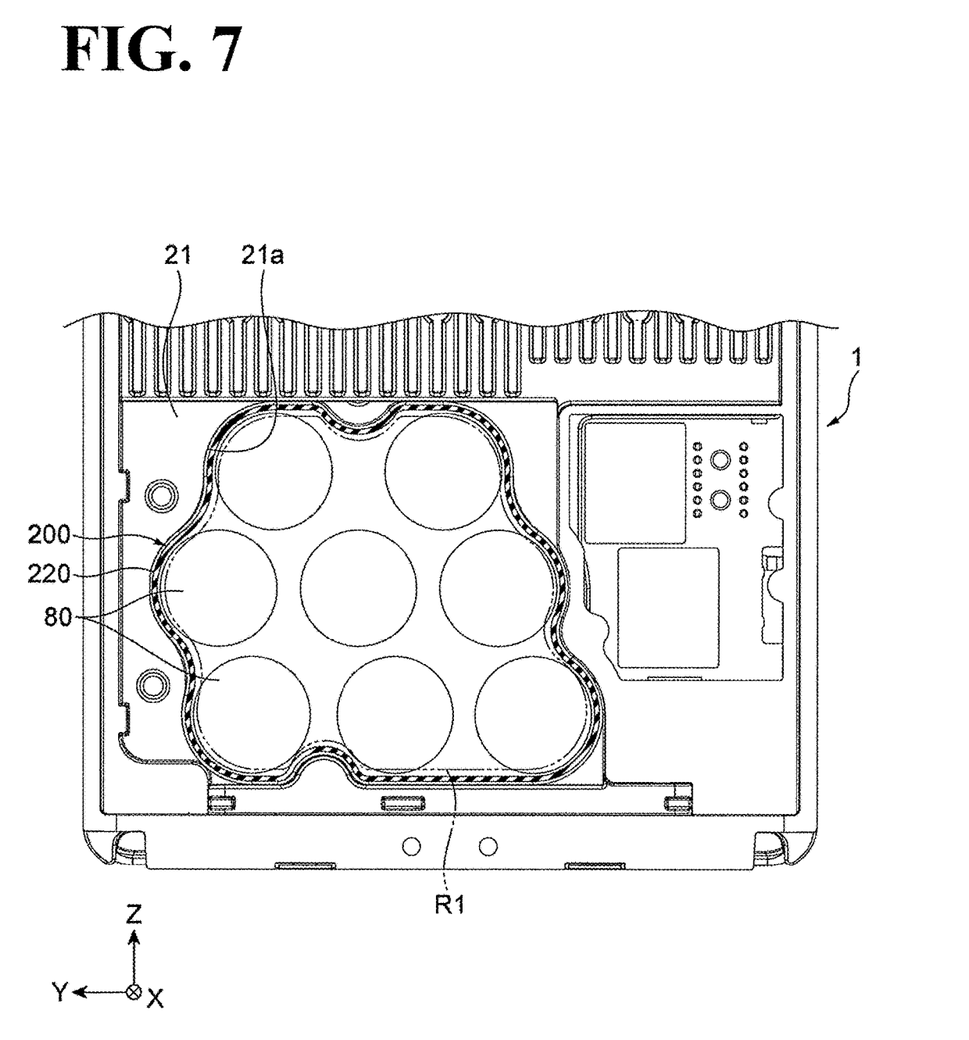
FIG. 7 is a sectional view taken along the line VII-VII illustrated in FIG. 6.
Figure 8:
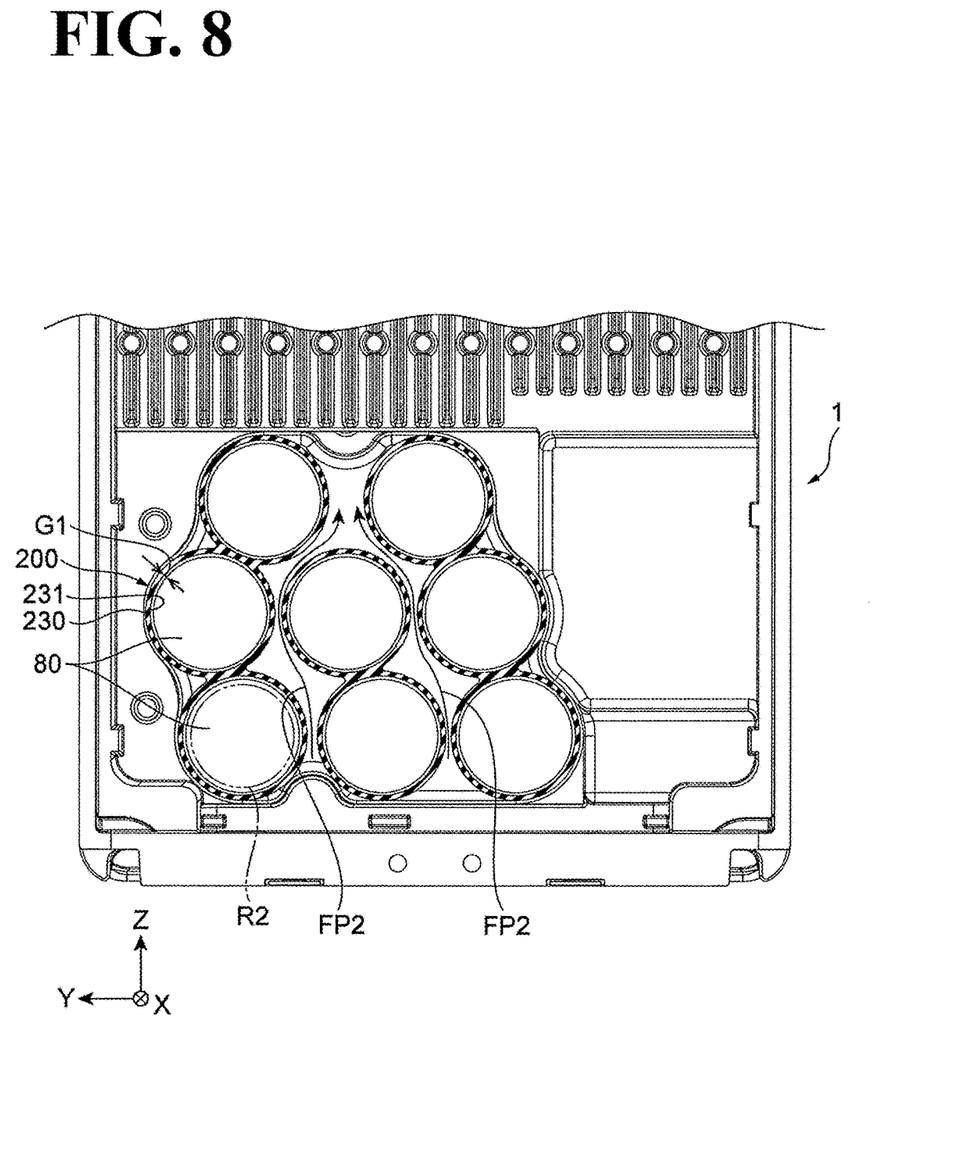
FIG. 8 is a sectional view taken along the line VIII-VIII illustrated in FIG. 6.

As illustrated in FIGS. 7 and 8, the first portion 220 and the second portion 230 each have a ring-shaped cross-section as viewed from the direction in which the at least one circuit element 80 protrudes. With this configuration, the cover 200 covers approximately the entire circumference of the at least one circuit element 80, improving reliability in protecting the at least one circuit element 80 from water, dust, and other foreign matter. As used herein, the adjective "ring-shaped" means that the first portion 220 and the second portion 230 are closed in the circumferential direction of the at least one circuit element 80. Insofar as this closed configuration is ensured, the first portion 220 and the second portion 230 may have an otherwise shaped cross-section.

The first portion 220 defines a region R1, and the second portion 230 defines a region R2. As viewed from the direction in which the at least one circuit element 80 protrudes (that is, as viewed from the rear direction), the area of the region R1 is larger than the area of the region R2. As used herein, the region defined by the first portion 220 is a portion surrounded by the first portion 220 in a cross-section of the first portion 220 orthogonal to the front-rear directions. The region defined by the second portion 230 is a portion surrounded by the second portion 230 in a cross-section of the second portion 230 orthogonal to the front-rear directions.

As viewed from the direction in which the cooling-fluid passage FP1 extends in the second space S2 (for example, as viewed from the upper or lower direction), the width, W2, of the second portion 230 is smaller than the width, W1, of the first portion 220. The cover 200 is made of an insulating material. Examples of the insulating material include, but are not limited to, rubber and polymeric elastomer.

As illustrated in FIGS. 4 to 8, the at least one circuit element 80 includes a plurality of circuit elements 80. The cover 200 includes a single first portion 220 or a plurality of first portions 220; and a plurality of second portions 230. The plurality of second portions 230 are larger in number than the single first portion 220 or the plurality of first portions 220. Each first portion 220 accommodates at least one circuit element 80, and at least one first portion 220 accommodates a plurality of circuit elements 80. Each second portion 230 accommodates at least one circuit element 80. Even though two first portions 220 may appear to be integral to each other, they will be assumed as separate first portions 220 if they are partitioned from each other internally. The same applies in the plurality of second portions 230. In this embodiment, the power converter 1 includes eight circuit elements 80, and the cover 200 includes a single first portion 220 and eight second portions 230.

At least some of the plurality of second portions 230 may be spaced apart from other second portions 230 to define a ventilation passage FP2 or ventilation passages FP2 between the some of the plurality of second portions 230 and the other second portions 230. The ventilation passage FP2 or the ventilation passages FP2 extends along the passage FP1. For example, the eight second portions 230 of the cover 200 are divided into three groups aligned in a direction crossing the passage FP1 (see FIG. 8). In each group, the second portions 230 appear to be integral to each other, whereas second portions 230 of different groups are spaced apart from each other. This configuration causes the ventilation passage FP2 or the ventilation passages FP2 to be defined. Forming the ventilation passage FP2 or the ventilation passages FP2 between the second portions 230 in this manner improves efficiency in cooling the circuit elements 80.

The second portion 230 has an inner surface formed according to the outer surface of the circuit element 80. This configuration minimizes the gap, G1, between the second portion 230 and the circuit element 80 over their entire circumferences. This, in turn, minimizes the area that the second portion 230 occupies, making the ventilation passage FP2 more readily formed. Minimizing the gap G1 over the entire circumferences of the second portion 230 and the circuit element 80 also prevents an air layer between the second portion 230 and the circuit element 80 from accumulating heat, making heat more readily discharged from the circuit elements 80.

As illustrated in FIG. 6, the power converter 1 includes a vibration isolator 81. The vibration isolator 81 surrounds the circuit element 80 in the first portion 220. In a possible embodiment with a plurality of circuit elements 80 provided in the first portion 220, the vibration isolator 81 may fill the gap between adjoining circuit elements 80. A non-limiting example of the material of the vibration isolator 81 is silicone potting agent.

As described above, the area of the region R1, which is defined by the first portion 220, is larger than the area of the region R2, which is defined by the second portion 230. This configuration ensures enough space in the first portion 220 for the vibration isolator 81 around the circuit element 80, improving vibration resistivity of the circuit element 80. Thus, making the area of the region R1 larger than the area of the region R2 serves as means for improving vibration resistivity of the circuit element 80.

The means for improving the vibration resistivity of the circuit element 80 is implemented by enlarging the space in the first portion 220 and arranging the vibration isolator 81 in the enlarged space. This configuration, however, is not intended in a limiting sense. For example, it is possible to improve the vibration resistivity of the circuit element 80 by making the wall of the first portion 220 thicker than the wall of the second portion 230 to make the wall of the first portion 220 in close contact with the circuit element 80. It is also possible to improve the vibration resistivity of the circuit element 80 by filling the gap between the first portion 220 and the circuit element 80 with the vibration isolator 81.

Figure 9:
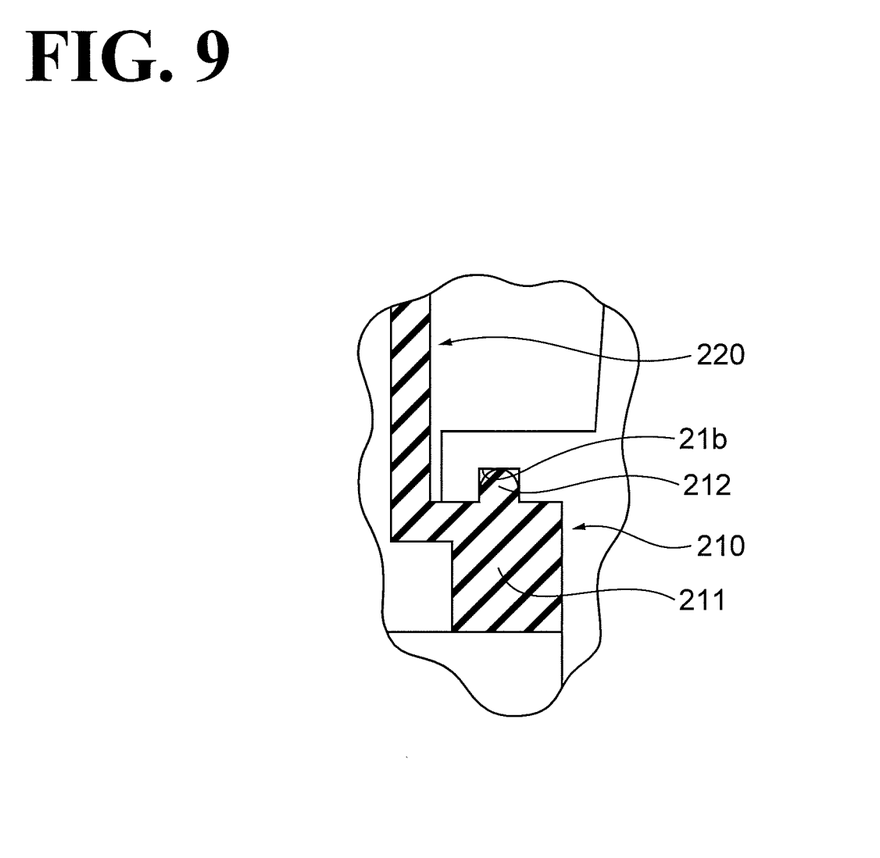
FIG. 9 is an enlarged view of a flange illustrated in FIG. 6.

As illustrated in FIG. 6, the cover 200 includes a flange 211. The flange 211 is held between the circuit substrate 5 and the wall 21. More specifically, the flange 211 is disposed on the edge of the base 210. At least one of the wall 21 and the circuit substrate 5 has a groove, and the flange 211 has a protrusion fitted with the groove. Specifically, as illustrated in FIG. 9, the wall 21 includes a groove 21b, and the flange 211 includes a protrusion 212, which is fitted with the groove 21b.

The cover 200 illustrated in the drawings are provided for exemplary purposes only, being open for various modifications insofar as the cover 200 includes the first portion 220 and the second portion 230, and the area of the region R1, which is defined by the first portion 220, is larger than the area of the region R2, which is defined by the second portion 230.

Figure 10:
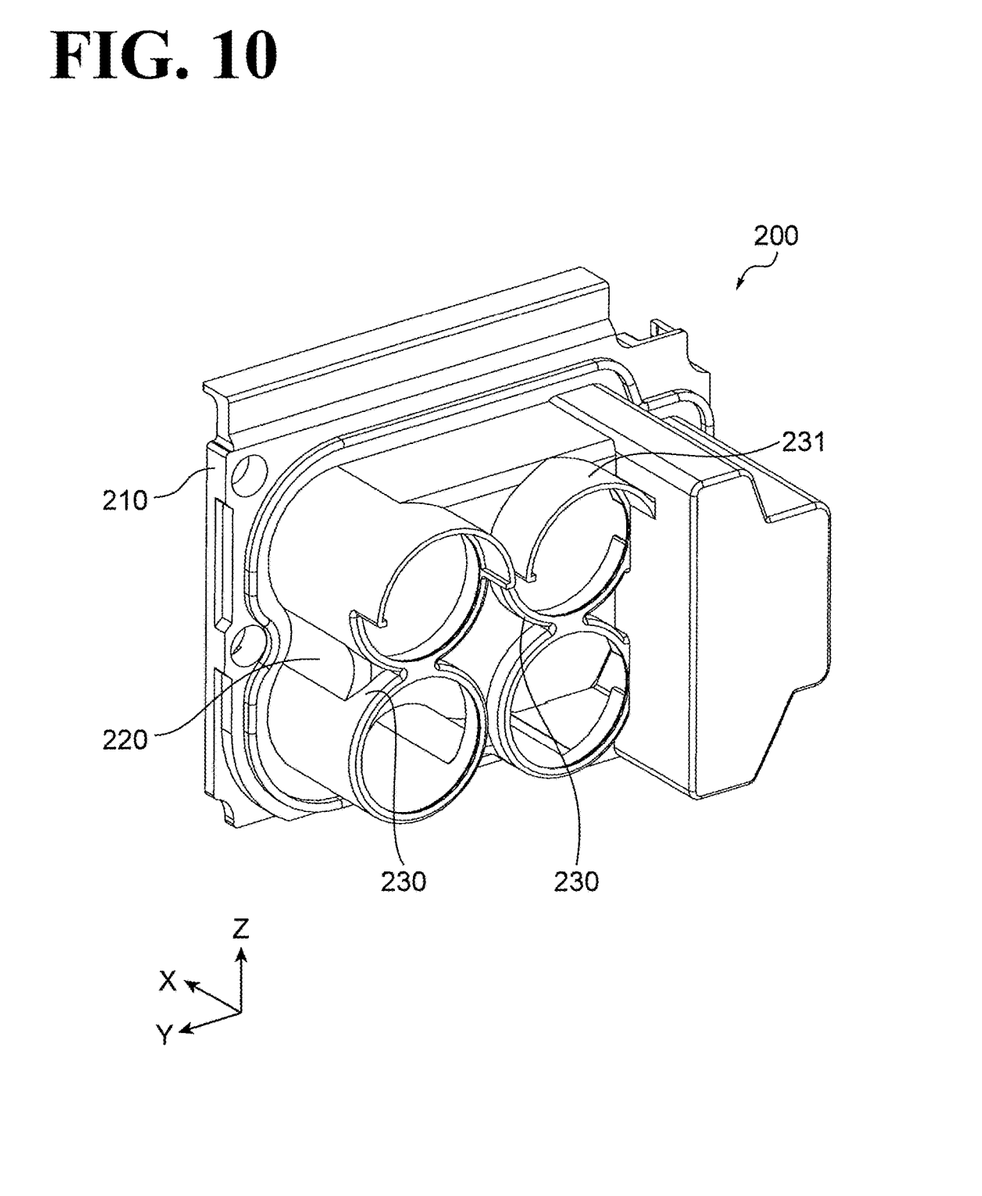
FIG. 10 is a perspective view of a modification of the cover.
Figure 11:
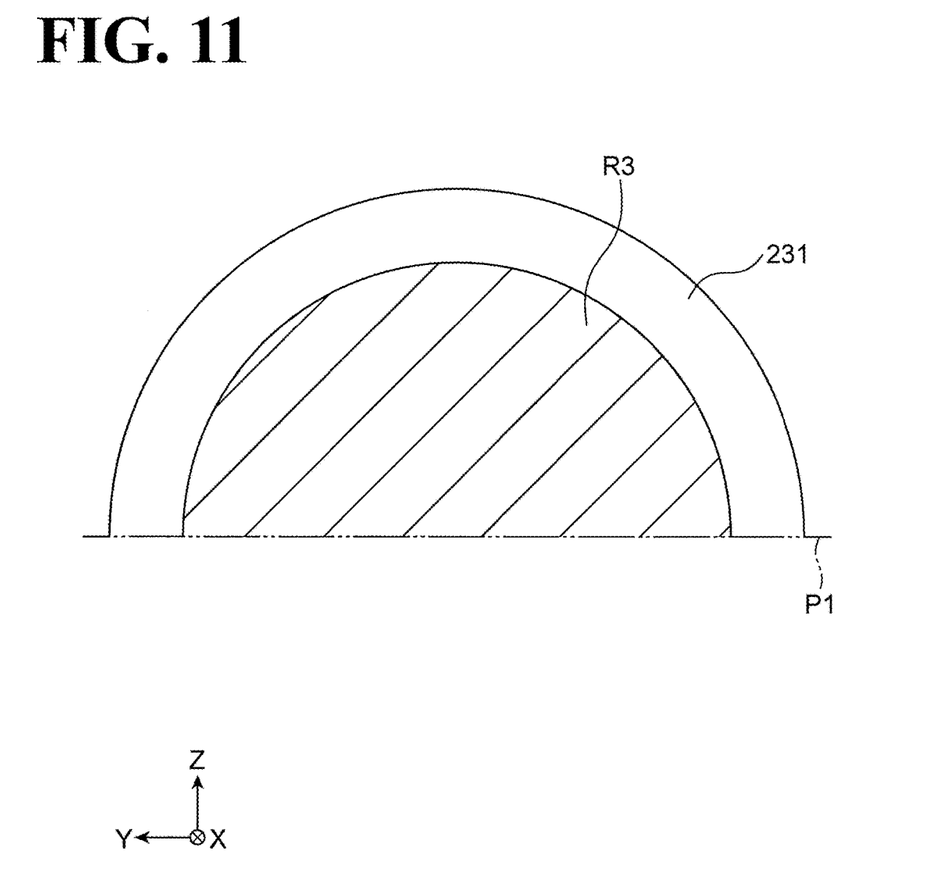
FIG. 11 illustrates a region surrounded by a roof of the cover.

As illustrated in FIG. 10, the second portion 230 may include a roof 231. The roof 231 covers an upper portion of the circuit element 80 and uncovers a lower portion of the circuit element 80. In the modification illustrated in FIG. 11, the second portion 230 is made up of the roof 231 alone. In this case, a region R3 corresponds to the region R2. The region R3 is defined by the roof 231 and an imaginary plane P1, which blocks a lower portion of the roof 231. In the modification that the second portion 230 includes the roof 231, the configuration that the fans 70 generate an upward air flow moving from the lower direction to the upper direction makes the lower portion of the circuit element 80 more directly exposed to the air flow at the roof 231. This improves reliability in cooling the circuit element 80.

3. Advantageous Effects of the Embodiment

As has been described hereinbefore, the power converter 1 includes the housing 10, the at least one circuit element 80, and the cover 200. The housing 10 includes the first space S1 and the second space S2. In the first space S1, the circuit substrate 5 is disposed. In the second space S2, the cooling-fluid passage FP1 is disposed. The at least one circuit element 80 is disposed on the circuit substrate 5 in the first space S1 and protrudes into the second space S2. The cover 200 covers at least a portion of the at least one circuit element 80. The cover 200 includes the first portion 220 and the second portion 230. The first portion 220 protrudes from near the circuit substrate 5 into the second space S2. The second portion 230 protrudes from the first portion 220. As viewed from the direction in which the at least one circuit element 80 protrudes, the area of the region R1, which is defined by the first portion 220, is larger than the area of the region R2, which is defined by the second portion 230.

With this configuration, the power converter 1 uses a part of the second space S2, which includes the cooling-fluid passage FP1, as space for accommodating the at least one circuit element 80. This configuration minimizes the outer shape of the power converter 1. With its minimized outer shape, the power converter 1 can be installed in a wider variety of environments. Additionally, the fluid passing through the second space S2 cools the at least one circuit element 80, improving the heat resistivity of the at least one circuit element 80. This makes the power converter 1 applicable to a wider variety of environments from a standpoint of the circuit element 80 INSERT-1Qs heat resistivity as well. The portion of the at least one circuit element 80 in the second space S2 is protected by the cover 200 from water, dust, and other foreign matter. In the cover 200, the area of the region R1, which is defined by the first portion 220, is larger than the area of the region R2, which is defined by the second portion 230. This configuration ensures enough space in the first portion 220 for the vibration isolator 81 or a similar device around the at least one circuit element 80, improving vibration resistivity of the at least one circuit element 80. Thus, the power converter 1 is reliable in protecting the at least one circuit element 80 while minimizing the outer shape of the power converter 1, resulting in improved versatility of the power converter 1.

As viewed from the direction in which the cooling-fluid passage FP1 extends in the second space S2, the width W2 of the second portion 230 may be smaller than the width W1 of the first portion 220. This configuration increases the amount of the fluid passing through the passage FP1 in the second portion 230, improving reliability in cooling the at least one circuit element 80. The above configuration also ensures that other members, if any, than the at least one circuit element 80 in the second space S2 (for example, the cooling fins 7) are cooled.

The at least one power converter 1 may include a plurality of circuit elements 80. The cover 200 may include a single first portion 220 or a plurality of first portions 220; and a plurality of second portions 230 larger in number than the single first portion 220 or the plurality of first portions 220. That is to say, the cover 200 are segmented at the second portions 230 and consolidated at the base (the first portion 220) of the cover 200. This configuration improves the strength of the cover 200 as a whole. Additionally, the ventilation passage FP2 is formed between the plurality of second portions 230. This configuration ensures that the circuit elements 80 are cooled more reliably. The above configuration also ensures that other members, if any, than the at least one circuit element 80 in the second space S2 (for example, the cooling fins 7) are cooled more reliably.

The power converter 1 may further include the vibration isolator 81. The vibration isolator 81 is disposed around the circuit element 80 in the first portion 220. Utilizing the internal space of the first portion 220 to accommodate the vibration isolator 81 improves the vibration resistivity of the circuit element 80.

The power converter 1 may include a plurality of circuit elements 80 and may further include the vibration isolator 81. The vibration isolator 81 is disposed around the circuit element 80 in the first portion 220 and fills the gap between adjoining circuit elements 80. That is to say, utilizing the structure that the plurality of circuit elements 80 are accommodated in the internal space of the first portion 220, the vibration isolator 81 is provided in the internal space of the first portion 220 to fill the gap between adjoining circuit elements 80. This configuration further improves the vibration resistivity of the circuit elements 80.

The second portion 230 may include the roof 231. The roof 231 covers an upper portion of the circuit element 80 and uncovers a lower portion of the circuit element 80. With this configuration of the roof 231, the lower portion of the circuit element 80 is exposed to a flow of fluid, improving reliability in cooling the circuit element 80.

The power converter 1 may further include the fans 70. The fans 70 generate an upward air flow moving from the lower direction to the upper direction in the second space S2. This configuration makes the lower portion of the circuit element 80 more directly exposed to the fluid from the fans 70 at the roof 231, improving reliability in cooling the circuit element 80.

The power converter 1 may further include the wall 21. The wall 21 partitions the first space S1 and the second space S2 from each other. The cover 200 may include the flange 211. The flange 211 is held between the circuit substrate 5 and the wall 21. With this configuration, the cover 200 can be utilized as a seal between the circuit substrate 5 and the wall 21. This improves reliability in protecting the circuit substrate 5 from water, dust, and other foreign matter.

At least one of the wall 21 and the circuit substrate 5 may include the groove 21b. The flange 211 may include the protrusion 212. The protrusion 212 is fitted with the groove 21b. The configuration that the flange 211 and the protrusion 212 are fitted with each other improves reliability in sealing between the circuit substrate 5 and the wall 21.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. A power converter comprising:
   a housing comprising:
   a first space in which a circuit substrate is disposed; and
   a second space in which a passage for a cooling fluid is disposed;
   at least one circuit element disposed on the circuit substrate in the first space and protruding into the second space; and
   a cover covering at least a portion of the at least one circuit element and comprising a first portion and a second portion, the first portion protruding from near the circuit substrate into the second space and defining a first region that comprises a first area, the second portion protruding from the first portion in a direction in which the circuit element protrudes and defining a second region that comprises a second area, the first area being larger than the second area as viewed from the direction in which the circuit element protrudes,
   wherein the direction that the circuit element protrudes is perpendicular to a wall partitioning the first space from the second space.

2. The power converter according to claim 1, wherein the second portion comprises a width smaller than a width of the first portion as viewed from a direction in which the passage in the second space extends.

3. The power converter according to claim 2,
   wherein the at least one circuit element comprises a plurality of circuit elements, and
   wherein the first portion of the cover comprises a single first portion or a plurality of first portions, and the second portion of the cover comprises a plurality of second portions larger in number than the single first portion or the plurality of first portions.

4. The power converter according to claim 1, further comprising a vibration isolator surrounding the at least one circuit element in the first portion.

5. The power converter according to claim 3, further comprising a vibration isolator surrounding the plurality of circuit elements in the first portion and filling a gap between adjoining circuit elements among the plurality of circuit elements.

6. The power converter according to claim 1, wherein the second portion of the cover comprises a roof covering an upper portion of the at least one circuit element and uncovering a lower portion of the at least one circuit element.

7. The power converter according to claim 6, further comprising a fan disposed in the second space to generate an upward air flow moving from a lower direction to an upper direction.

8. The power converter according to claim 1, further comprising the wall partitioning the first space and the second space from each other,
   wherein the cover comprises a flange disposed between the circuit substrate and the wall.

9. The power converter according to claim 8,
   wherein at least one of the wall and the circuit substrate comprises a groove, and
   wherein the flange comprises a protrusion fitted with the groove.

10. The power converter according to claim 2, further comprising a vibration isolator surrounding the at least one circuit element in the first portion.

11. The power converter according to claim 3, further comprising a vibration isolator surrounding the at least one circuit element in the first portion.

12. The power converter according to claim 2, wherein the second portion of the cover comprises a roof covering an upper portion of the at least one circuit element and uncovering a lower portion of the at least one circuit element.

13. The power converter according to claim 3, wherein the second portion of the cover comprises a roof covering an upper portion of the at least one circuit element and uncovering a lower portion of the at least one circuit element.

14. The power converter according to claim 4, wherein the second portion of the cover comprises a roof covering an upper portion of the at least one circuit element and uncovering a lower portion of the at least one circuit element.

15. The power converter according to claim 5, wherein the second portion of the cover comprises a roof covering an upper portion of the at least one circuit element and uncovering a lower portion of the at least one circuit element.

16. The power converter according to claim 10, wherein the second portion of the cover comprises a roof covering an upper portion of the at least one circuit element and uncovering a lower portion of the at least one circuit element.

17. The power converter according to claim 11, wherein the second portion of the cover comprises a roof covering an upper portion of the at least one circuit element and uncovering a lower portion of the at least one circuit element.

18. The power converter according to claim 12, further comprising a fan disposed in the second space to generate an upward air flow moving from a lower direction to an upper direction.

19. The power converter according to claim 13, further comprising a fan disposed in the second space to generate an upward air flow moving from a lower direction to an upper direction.

20. The power converter according to claim 14, further comprising a fan disposed in the second space to generate an upward air flow moving from a lower direction to an upper direction.

* * * * *